United States Patent [19]
Yamazaki

[11] 4,320,249
[45] Mar. 16, 1982

[54] HETEROJUNCTION TYPE SEMICONDUCTOR PHOTOELECTRIC CONVERSION DEVICE

[76] Inventor: Shunpei Yamazaki, 21-21 Kitakarasuyama 7-chome, Setagaya-ku, Tokyo, Japan

[21] Appl. No.: 177,408

[22] Filed: Aug. 12, 1980

[30] Foreign Application Priority Data

Aug. 13, 1979 [JP] Japan .................. 54-102905
Aug. 13, 1979 [JP] Japan .................. 54-102906

[51] Int. Cl.$^3$ .................................. H01L 31/06
[52] U.S. Cl. ........................... 136/255; 136/252; 136/261; 136/258; 357/30
[58] Field of Search ............ 136/252, 255, 258, 261; 357/30

[56] References Cited

U.S. PATENT DOCUMENTS

| | | | |
|---|---|---|---|
| 3,952,323 | 4/1976 | Tanimura et al. | 357/15 |
| 4,162,505 | 7/1979 | Hanak | 357/30 |
| 4,193,821 | 3/1980 | Feng et al. | 148/1.5 |
| 4,227,943 | 10/1980 | Cohen et al. | 136/255 |

OTHER PUBLICATIONS

E. J. Charlson et al., "An MIS Photovoltaic Cell with Silicon Nitride Insulator", *Conf. Record, 13th IEEE Photovoltaic Specialists Conf.* (1978), pp. 656-660.

*Primary Examiner*—Aaron Weisstuch
*Attorney, Agent, or Firm*—Gerald J. Ferguson, Jr.; Joseph J. Baker

[57] ABSTRACT

A heterojunction type semiconductor photoelectric conversion device which comprises a semiconductor layer, a light-transparent, conductive layer disposed on the semiconductor layer to form therebetween a heterojunction, and a conductive layer disposed on the semiconductor layer on the opposite side from the light-transparent, conductive layer, and in which when light is incident to the semiconductor layer from the outside of the light-transparent, conductive layer, a photo-electric conversion function is obtained by the presence of the barrier of the heterojunction formed between the semiconductor layer and the light-transparent, conductive layer.

In such a heterojunction type semiconductor photoelectric conversion device, a light-transparent, current-permeable nitride layer is artificially formed in the barrier of the heterojunction formed between the semiconductor layer and the light-transparent, conductive layer. The light-transparent, current-permeable nitride layer is an insulating, semi-insulating or conductive layer. The insulating nitride layer is made of a silicon nitride. The semi-insulating nitride layer is made of a silicon nitride and a conductive metal nitride. The conductive nitride layer is made of a conductive metal nitride.

In the abovesaid heterojunction type semiconductor photoelectric conversion device, the light-transparent, conductive layer is made of a light-transparent, conductive nitride, which is a conductive metal nitride.

8 Claims, 4 Drawing Figures

HETEROJUNCTION TYPE SEMICONDUCTOR PHOTOELECTRIC CONVERSION DEVICE

BACKGROUND OF THE INVENTION

1. Field of the Invention

This invention relates to a heterojunction type semiconductor photoelectric conversion device which is of particular utility when employed in a solar battery.

2. Description of the Prior Art

A heterojunction type semiconductor photoelectric conversion device is, in principle, provided with a semiconductor layer, a light-transparent, conductive layer deposited on the semiconductor layer to form therebetween a heterojunction and a conductive layer deposited on the semiconductor layer on the opposite side from the light-transparent, conductive layer; and the heterojunction type semiconductor photoelectric conversion device is arranged so that when light is incident to the semiconductor layer from the outside of the light-transparent, conductive layer, a photoelectric conversion function is provided by the presence of a barrier which is set up by the heterojunction.

In such a conventional heterojunction type semiconductor photoelectric conversion device, there is formed, in the barrier of the heterojunction, a layer which is formed inherently during the deposition of the light-transparent, conductive layer or the semi-conductor layer and which is formed of an oxide of the semiconductor forming the semiconductor layer and has a sufficiently small thickness to permit the passage therethrough of current. Since the semiconductor layer is usually formed of silicon, the abovesaid layer formed in the barrier of the heterojunction is usually formed of a silicon oxide.

Such an oxide layer formed in the barrier of the heterojunction has active oxygen, and hence is unstable chemically. Accordingly, the oxide layer, when heated, is liable to chemically react with the semiconductor layer, the light-transparent, conductive layer and an undesirable impurity from the outside.

Accordingly, the conventional heterojunction type photoelectric conversion device has the defect that when it is exposed to high temperature for a long time, the thickness and height of the barrier set up by the heterojunction varies, resulting in a degraded photoelectric conversion characteristic and lowered photoelectric conversion effficiency.

In general, the oxide layer has a large energy band gap and when the oxide layer is a silicon oxide layer, the energy band gap is as large as 8 eV.

Consequently, even if the oxide layer formed in the barrier of the heterojunction is so thin that a current may pass through the oxide layer, the layer itself does not readily permit the passage therethrough of current and has high resistance.

Accordingly, the prior art heterojunction type semiconductor photoelectric conversion device has the defects of poor photoelectric conversion characteristic and very low photoelectric conversion efficiency.

Furthermore, in the conventional heterojunction type semiconductor photoelectric conversion device, even if the oxide layer is formed in the barrier of the heterojunction, the oxide layer is likely to pass an undesirable impurity from the light-transparent conductive layer or the outside thereof to the semiconductor layer and an useful impurity introduced in the semiconductor layer to the light-transparent, conductive layer.

As a consequence, the conventional heterojunction type semiconductor photoelectric conversion device is defective in that in long term use, the photoelectric conversion characteristic is deteriorated and, in particular, the photoelectric conversion efficiency is lowered.

Moreover, since the oxide layer in the barrier of the heterojunction is inherently formed, there is the possibility of the oxide layer being formed so thick as not to permit the passage of current therethrough.

Accordingly, the prior art heterojunction type semiconductor photoelectric conversion device has the drawback that it is difficult to obtain the desired excellent photoelectric conversion characteristics and high photoelectric conversion efficiency.

SUMMARY OF THE INVENTION

Accordingly, it is an object of the present invention to provide a novel heterojunction type semiconductor photoelectric conversion device which is free from the abovesaid shortcomings of the prior art.

In an example of the heterojunction type semiconductor photoelectric conversion device according to the present invention, a light-transparent, conductive layer is deposited on a semiconductor layer to form therebetween a heterojunction, as is the case with the prior art, but there is provided in the barrier of the heterojunction a light-transparent, current-permeable nitride layer which is deliberately formed in place of the aforementioned oxide layer formed inherently.

The abovesaid light-transparent, current-permeable nitride layer thus formed in the barrier of the heterojunction has no active oxygen, and hence is very stable chemically. Therefore, the nitride layer, even if heated, does not readily react chemically with the semiconductor layer, the light-transparent, conductive layer and an undesirable impurity from the outside.

Accordingly, the heterojunction type semiconductor photoelectric conversion device of the present invention has the advantage that even if it is placed in a high temperature condition for many hours, the thickness and height of the barrier of the hetero-junction hardly vary, and consequently the photoelectric conversion characteristic and the photoelectric conversion efficiency are hardly degraded.

In general, a layer formed of a nitride has a smaller energy band gap than that of an oxide layer.

Therefore, the abovesaid nitride layer formed in the barrier of the heterojunction readily passes current therethrough and has low resistance as compared with the oxide layer.

Accordingly, the heterojunction type semiconductor photoelectric conversion device of the present invention is excellent in photoelectric conversion characteristic and far higher in photoelectric conversion efficiency as compared with the prior art heterojunction type semiconductor photoelectric conversion device described previously.

Moreover, the abovesaid nitride layer formed in the barrier of the heterojunction substantially inhibits the passage therethrough of an undesirable impurity from the light-transparent, conductive layer or the outside thereof to the semiconductor layer and of a useful impurity introduced in the semiconductor layer to the light-transparent, conductive layer.

Accordingly, the heterojunction type semiconductor photoelectric conversion device of the present invention has such an advantage that even after it is used for a long time, the photoelectric conversion characteristic and the photoelectric conversion efficiency are hardly deteriorated.

Furthermore, since the nitride layer is deliberately formed, even when it is formed to have an insulating property, a native oxide layer which tends to be inherently formed between the semiconductor layer and the light-transparent, conductive layer is not formed, and since the nitride layer is very stable chemically, it can easily be formed to be current-permeable.

Accordingly, the heterojunction type semiconductor photoelectric conversion device of the present invention can easily be manufactured to be equipped with predetermined photoelectric conversion characteristics and high photoelectric conversion efficiency.

Another example of the heterojunction type semiconductor photoelectric conversion device of the present invention has, in principle, the aforesaid arrangement that a light-transparent, conductive layer is disposed on a semiconductor layer to form therebetween a heterojunction, but the light-transparent, conductive layer is formed of a nitride and a current-permeable nitride layer is deliberately formed in the barrier set up by the heterojunction.

The nitride layer making up the light-transparent, conductive layer and the nitride layer formed in the barrier of the heterojunction are very stable chemically, as described previously. And these nitride layers are markedly smaller in band gap energy than the oxide layer and substantially inhibit the passage therethrough of an undesirable impurity from the outside of the light-transparent, conductive layer to the semiconductor layer and of a useful impurity from the semiconductor layer to the light-transparent, conductive layer.

Accordingly, as is the case with the aforesaid example of the present invention, this example of the heterojunction type semiconductor conversion device of the present invention has the advantages that even if it is exposed to high temperature for many hours or even after having been used for a long period of time, the photoelectric conversion characteristic is hardly degraded and the photoelectric conversion efficiency is also hardly lowered, and that it is excellent in photoelectric conversion characteristic and high in photoelectric conversion efficiency, as compared with the conventional heterojunction type semiconductor photoelectric conversion device.

Other subjects, features and advantages of the present invention will become apparent from the following description taken in conjunction with the accompanying drawings.

DESCRIPTION OF THE PREFERRED EMBODIMENTS

Figure 1:
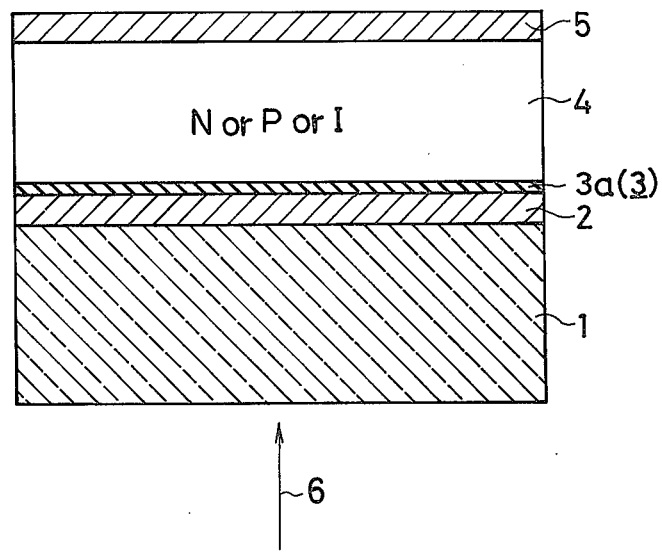
FIG. 1 is a schematic sectional view illustrating an embodiment of the heterojunction type semiconductor photoelectric conversion device of the present invention.

FIG. 1 illustrates in section a first embodiment of the heterojunction type semiconductor photoelectric conversion device of the present invention, in which a light-transparent, conductive layer 2 is formed on a transparent substrate 1 as of glass.

The light-transparent, conductive layer 2 has a work function difference between it and a semiconductor layer 4 and may be formed of a conductive metal oxide, which is selected from a group consisting of indium oxide, tin oxide and antimony oxide, or a mixture or compound of two or more kinds of them. The light-transparent, conductive layer 2 may also be formed by introducing into the abovesaid conductive metal oxide layer, in an amount of 0.1 to 10% relative thereto, a conductive material which is selected from a group consisting of tantalum, tungstem, molybdenum, zirconium, titanium, vanadium, chromium, lead, nickel, tin and germanium or a mixture or compound of two or more of the above. Also it is possible to form the light-transparent, conductive layer 2 of a conductive metal nitride, which is selected from a group consisting of titanium nitride, tantalum nitride, tin nitride, antimony nitride, germanium nitride, niobium nitride, tungsten nitride and chromium nitride, or a mixture or compound of two or more of the above. Further, the light-transparent, conductive layer 2 may also be obtained by introducing the abovesaid conductive material into the abovementioned conductive metal nitride layer. Also the light-transparent, conductive layer 2 may be a layer which is formed of the abovesaid metal oxide and metal nitride and into which the abovementioned conductive material is introduced.

On the light-transparent, conductive layer 2 is formed a nitride layer 3 which is light-transparent and current-permeable. The nitride layer 3 may also be made an insulating or semi-insulating layer 3a. In this case, the layer 3a is formed thin enough to permit the passage therethrough of current, for instance, 5 to 100 Å thick. The insulating nitride layer 3a in this case may be formed as a silicon nitride layer, and the semi-insulating nitride layer 3a may also be obtained by introducing the aforesaid conductive material into the silicon nitride layer. Furthermore, the semi-insulating nitride layer may be formed of the silicon nitride and the aforesaid conductive metal nitride and may also be obtained by introducing the aforementioned conductive material into such a layer.

On the light-transparent, current-permeable nitride layer 3 overlying the light-transparent, conductive layer 2 is formed an N or P type or intrinsic (I type) semiconductor layer 4.

The semiconductor layer 4 can be formed of a single crystal semiconductor, in particular, single crystal silicon but may also be a layer which is made, by a known plasma CVD method, glow discharge method, low-pressure CVD method or the like, of a non-single-crystal semiconductor such as an amorphous semiconductor, a polycrystalline semiconductor or the like, especially, non-single-crystal silicon such as amorphous silicon, polycrystalline silicon or the like. Further, the semiconductor layer 4 may also be a layer of the abovesaid non-single-crystal semiconductor, in particular, non-single-crystal silicon, formed on the nitride layer 3 which has been partially or wholly annealed by irradiation, for example, by laser light, into single crystal. The latter is preferred since the carrier mobility is 10 to $10^3$ times as high as in the case of the former.

The formation of the semiconductor layer 4 on the light-transparent, conductive layer 2 with the nitride layer 3 sandwiched therebetween provides a structure in which the light-transparent, conductive layer 2 is disposed on the semiconductor layer 4 to form therebetween a heterojunction and the nitride layer 3 is formed in the barrier of the heterojunction.

Deposited over the entire area of the surface of the semiconductor layer 4 on the opposite side from the nitride layer 3 is a conductive layer 5 which is a counterpart of the light-transparent, conductive layer 2. In this case, it is also possible to interpose between the semiconductor layer 4 and the conductive layer 5 a current-permeable nitride layer which is similar to the abovesaid light-transparent, current-permeable nitride layer 3 and need not always be light-transparent. However, the conductive layer 5 can be deposited directly on the semiconductor layer 4 to make ohmic contact therewith, as shown. The conductive layer 5 may be made of an arbitrary material; for example, the layer 5 can be formed as an aluminum layer made by vacuum evaporation. In the case of depositing the conductive layer 5 directly on the semiconductor layer 4, the conductive layer 5 can be formed, by the CVD method, of a polycrystalline semiconductor doped with a large quantity of an N or P type impurity, or undoped, depending on whether the semiconductor layer 4 is N, P, or I type.

Figure 2:
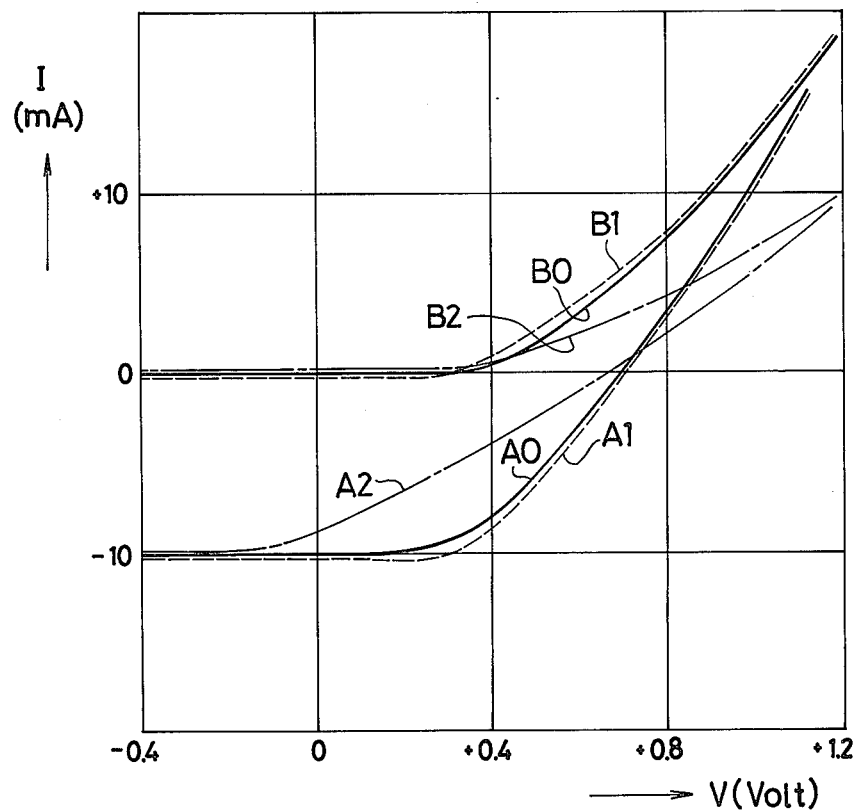
FIG. 2 is a V-I characteristic graph explanatory of the embodiment shown in FIG. 1.

The above is the construction of the first embodiment of the heterojunction type semiconductor photoelectric conversion device of the present invention. Since the above embodiment bears an apparent resemblance to the conventional heterojunction type semiconductor photoelectric conversion device, the photoelectric conversion function can be obtained with the same mechanism as in the prior art. The mechanism, though not described in detail, is as follows: When light is incident the semiconductor layer 4 through the light-transparent, conductive layer 2 and the light-transparent, current-permeable nitride layer 3 from the outside of the transparent substrate 1, as indicated by the arrow 6, carriers generated by the incident light are produced in a depletion layer spreading from the heterojunction formed in the semiconductor layer 4 on the side of the nitride layer 3. In this case, if the semiconductor layer 4 is N or I type, electrons and holes comprising the carriers reach the conductive layers 5 and 2, respectively whereas if the semiconductor layer 4 is P or I type, they reach the conductive layers 2 and 5 respectively. By this mechanism, there can be obtained such a photoelectric conversion function that a current corresponding to the intensity of the incident light flows via the conductive layers 2 and 5. Now, considering the photoelectric conversion function in view of the relationship of current I (milliampere (mA)) flowing through the conductive layers 2 and 5 with respect to a voltage V (volt (V)) applied to the conductive layers 2 and 5, that is, in view of the V-I characteristic, the dark characteristic in the absence of the light 6 can be obtained, as indicated by curve AO in FIG. 2, and when the light 6 is incident with an intensity of AM 1 (the intensity of the sunlight on the equator, about 100 milliwatts/cm$^2$), the V-I characteristic can be obtained as shown by curve BO in FIG. 2.

In the heterojunction type semiconductor photoelectric conversion device of the present invention, shown in FIG. 1, however, the light-transparent, current-permeable nitride layer 3 is formed in the barrier of the heterojunction between the semiconductor layer 4 and the light-transparent, conductive layer 2. The nitride layer 3 has no active oxygen, and hence is very stable chemically.

Accordingly, for the reasons set forth in "Summary of the Invention", the heterojunction type semiconductor photoelectric conversion device of FIG. 1 exhibits the advantage that even if it is exposed to high temperature for many hours, the thickness and height of the barrier set up by the heterojunction formed between the semiconductor layer 4 and the light-transparent, conductive layer 5 hardly vary, holding the photoelectric conversion characteristic and the photoelectric conversion efficiency substantially unchanged. This has been ascertained by my experiments in which after the heterojunction type semiconductor photoelectric conversion device of FIG. 1 was exposed to as high a temperature as 150° C. for as long a time as 1000 hours, the same V-I characteristic as that when the curves A0 and B0 were obtained, as shown by curves A1 and B1 in FIG. 2 which were substantially the same as the curves A0 and B0. Incidentally, a similar experiment was also conducted on a semiconductor photoelectric conversion device which was identical in construction with the embodiment of FIG. 1 except that the nitride layer 3 in the barrier of the heterojunction between the semiconductor layer 4 and the light-transparent, conductive layer 2 was replaced by an oxide layer, and which had such a V-I characteristic as shown by the curves A0 and B0 in FIG. 2. After the semiconductor photoelectric conversion device was similarly exposed to the high temperature of 150° C. for 1000 hours, the same V-I characteristic as that when the curves A0 and B0 were obtained was measured. The V-I characteristic thus measured, as shown by curves A2 and B2, greatly differed from the curves A0 and B0; namely, the V-I characteristic was very poor as compared with the V-I characteristic of the device of the present invention.

In the embodiment of FIG. 1, the nitride layer 3 formed in the barrier of the heterojunction between the semiconductor layer 4 and the light-transparent, conductive layer 2 has a small energy band gap as compared with the oxide layer. In other words, the nitride layer 3 readily passes current therethrough and has a low resistance.

As a result of that, the embodiment of FIG. 1 has an excellent photoelectric conversion efficiency which is 20 to 40% higher than that obtainable with the conventional heterojunction type semiconductor conversion device.

Furthermore, the nitride layer 3 in the embodiment of FIG. 1 substantially inhibits the passage therethrough of an undesirable impurity from the light-transparent, conductive layer 2 or the outside thereof to the semiconductor layer 4 and of an effective impurity introduced in the semiconductor layer 4 to the light-transparent, conductive layer 2.

Accordingly, the embodiment of FIG. 1 is advantageous in that even after it is used for a long period of time, the photoelectric conversion characteristic is hardly deteriorated and the photoelectric conversion efficiency is hardly lowered.

Moreover, the nitride layer 3 is formed deliberately; namely, formation, of an oxide layer which would otherwise be formed between the semiconductor layer 4 and the light-transparent, cnductive layer 2 is prevented substantially, and the nitride layer 3 is very stable chemically. Therefore, the nitride layer 3 can easily be formed to be current-permeable.

Accordingly, the embodiment of FIG. 1 can easily be fabricated to have a predetermined photoelectric conversion characteristic and high photoelectric conversion efficiency.

Figure 3:
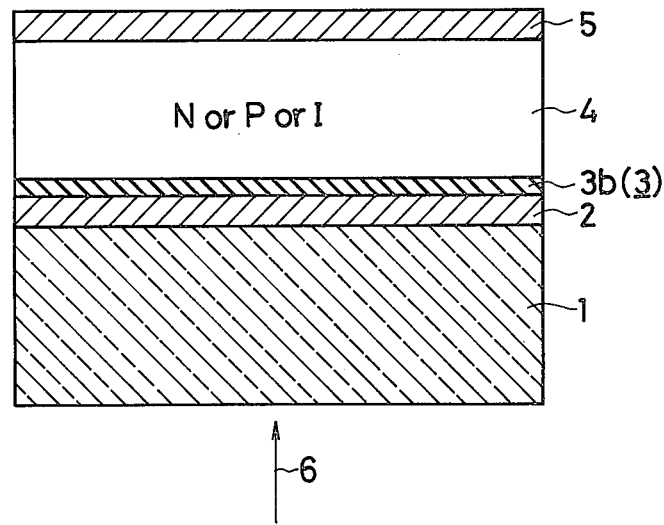
FIG. 3 is a schematic sectional view illustrating another embodiment of the heterojunction type semiconductor photoelectric conversion device of the present invention.

FIG. 3 illustrates another embodiment of the heterojunction type semiconductor photoelectric conversion device of the present invention. The illustrated embodiment is identical in construction with the embodiment of FIG. 1 except that the light-transparent, current-permeable nitride layer 3 formed in the barrier of the heterojunction between the light-transparent, conductive layer 2 and the semiconductor layer 4 is a conductive layer $3b$ in place of the insulating or semi-insulating layer $3a$. In this case, the thickness of the conductive layer $3b$ can be selected as desired, for example, 0.3 to $3\mu$. The conductive nitride layer $3b$ can be formed of a metal nitride, which is selected from the group of titanium nitride, tantalum nitride, tin nitride, antimony nitride, germanium nitride, niobium nitride, tungsten nitride and chromium nitride, or a mixture of compound of two or more of the above. Such a metal nitride layer can be formed by known vapor growth method. Further, the conductive nitride layer $3b$ can also be obtained by introducing the aforesaid conductive material into the abovesaid metal nitride layer.

The above is the construction of another embodiment of the present invention. Since this embodiment is identical in construction with the embodiment of FIG. 1 except in the abovesaid difference, no detailed description will be repeated but it has the same advantages as the embodiment of FIG. 1.

Figure 4:
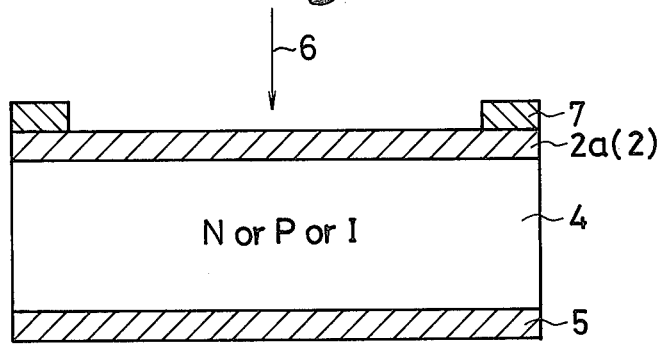
FIG. 4 is a schematic sectional view illustrating still another embodiment of the heterojunction type semiconductor photoelectric conversion device of the present invention.

FIG. 4 illustrates another embodiment of the heterojunction type semiconductor photoelectric conversion device of the present invention. This embodiment is also identical in construction with the embodiment of FIG. 1 except that the substrate 1 and the light-transparent current-permeable nitride layer 3 are omitted, the light-transparent, conductive layer 2 is a light-transparent, conductive nitride layer $2a$, and a lead-out electrode 7 is deposited on the light-transparent, conductive nitride layer $2a$. In this case, since the light-transparent, conductive layer 2 is the nitride layer 2, the photoelectric conversion device of this embodiment has such an arrangement in which instead of the light-transparent, current-permeable nitride layer 3, a light-transparent, current-permeable nitride layer is formed inherently in the barrier of the heterojunction provided between the light-transparent, conductive layer 2 which is the light-transparent, conductive nitride layer $2a$ and the semiconductor layer 4. Further, the light-transparent, conductive nitride layer $2a$ as the light-transparent, conductive layer 2 can be formed by introducing the aforementioned conductive layer into the aforesaid conductive metal nitride layer.

The above is the construction of a further embodiment of the heterojunction type semiconductor photoelectric conversion device of the present invention. Since this embodiment is identical in construction with the embodiment of FIG. 1 except in the abovesaid differences, no detailed description will be repeated but it has the same advantages as the embodiment of FIG. 1. In this case, since the light-transparent, conductive layer 2 is the light-transparent, conductive nitride layer $2a$, the abovesaid advantages are further promoted.

The foregoing embodiments are merely illustrative of the present invention and should not be construed as limiting the present invention specifically thereto. For example, it is possible to introduce nitrogen into the light-transparent, conductive layer 2 and/or the light-transparent, current-permeable nitride layer 3 so as to enhance its chemical stability. Also it is possible to introduce nitrogen into the region of the semiconductor layer 4 on the side of the light-transparent, current-permeable nitride layer 3 to obtain a wide to narrow energy band gap structure in which the abovesaid region of the semiconductor layer 4 has a larger energy band gap than the other region of the layer 4, thereby to enable highly sensitive photoelectric conversion. Many modifications and variations may be effected without departing from the spirit of the present invention.

What is claimed is:

1. A heterojunction type semiconductor photoelectric conversion device which comprises a semiconductor layer, a light-transparent, conductive layer disposed on the semiconductor layer to form therebetween a heterojunction having a barrier, and a conductive layer disposed on the semiconductor layer on the opposite side from the light-transparent, conductive layer, characterized in that a light-transparent, current-permeable nitride layer is formed in the barrier of the heterojunction provided between the semiconductor layer and the light-transparent, conductive layer, the light-transparent, current-permeable nitride layer being insulating or semi-insulating and formed of a silicon nitride and a conductive metal nitride.

2. A heterojunction type semiconductor photoelectric conversion device which comprises a semiconductor layer, a light-transparent, conductive layer disposed on the semiconductor layer to form therebetween a heterojunction having a barrier, and a conductive layer disposed on the semiconductor layer on the opposite side from the light-transparent, conductive layer, characterized in that a light-transparent, current-permeable nitride layer is formed in the barrier of the heterojunction provided between the semiconductor layer and the light-transparent, conductive layer, the light-transparent, current-permeable nitride layer being conductive and formed of a conductive metal nitride.

3. A heterojunction type semiconductor photoelectric conversion device which comprises a semiconductor layer, a light-transparent, conductive layer disposed on the semiconductor layer to form therebetween a heterojunction having a barrier, and a conductive layer disposed on the semiconductor layer on the opposite side from the light-transparent, conductive layer, characterized in that a light-transparent, current-permeable nitride layer is formed in the barrier of the heterojunction provided between the semiconductor layer and the light-transparent, conductive layer, the light-transparent, conductive layer being formed of a conductive metal nitride.

4. A heterojunction type semiconductor photoelectric conversion device according to claim 3, where the light-transparent, current-permeable nitride layer is insulating or semi-insulating.

5. A heterojunction type semiconductor photoelectric conversion device according to claim 4, where the insulating or semi-insulating nitride layer is formed of silicon nitride.

6. A heterojunction type semiconductor photoelectric conversion device according to claim 4, where the insulating or semi-insulating nitride layer is formed of a silicon nitride and a conductive metal nitride.

7. A heterojunction type semiconductor photoelectric conversion device according to claim 3, where the light-transparent, current-permeable nitride layer is conductive, and formed of a conductive metal nitride.

8. A heterojunction type semiconductor photoelectric conversion device which comprises a semiconductor layer, a light-transparent, conductive layer disposed on the semiconductor layer to form therebetween a heterojunction having a barrier, and a conductive layer disposed on the semiconductor layer on the opposite side from the light-transparent, conductive layer, characterized in that the light-transparent, conductive layer is formed of a conductive metal nitride.

* * * * *